United States Patent
Gordon et al.

(10) Patent No.: US 11,840,459 B1
(45) Date of Patent: Dec. 12, 2023

(54) TUNABLE NEGATIVE COEFFICIENT THERMAL EXPANSION MATERIALS AND COMPOSITES

(71) Applicant: National Technology & Engineering Solutions of Sandia, LLC, Albuquerque, NM (US)

(72) Inventors: Margaret Ellen Gordon, Albuquerque, NM (US); Clay Payne, Albuquerque, NM (US); Charles R. Bryan, Albuquerque, NM (US); Mark A. Rodriguez, Albuquerque, NM (US); Ashley Maes, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 189 days.

(21) Appl. No.: 17/401,905

(22) Filed: Aug. 13, 2021

Related U.S. Application Data

(60) Provisional application No. 63/065,052, filed on Aug. 13, 2020.

(51) Int. Cl.
*C01G 41/00* (2006.01)
*H01L 31/049* (2014.01)
*C08L 63/00* (2006.01)
*C08L 67/02* (2006.01)

(52) U.S. Cl.
CPC ........... *C01G 41/006* (2013.01); *C08L 63/00* (2013.01); *C08L 67/02* (2013.01); *H01L 31/049* (2014.12); *C01P 2006/32* (2013.01); *C08L 2203/204* (2013.01)

(58) Field of Classification Search
CPC ....... C01G 41/006; C08L 63/00; C08L 67/02; C08L 2203/204; H01L 31/049; C01P 2006/32
See application file for complete search history.

(56) References Cited

PUBLICATIONS

Mittal et al. "Electrochemical Studies on Zirconium Phosphotungstate Based Heterogeneous Membranes" J. New. Mat. Electrochemical Systems 4, 221-226 (2001) (Year: 2001).*

* cited by examiner

*Primary Examiner* — Andrew J. Oyer
(74) *Attorney, Agent, or Firm* — Daniel J. Jenkins

(57) ABSTRACT

The present disclosure is directed to variable composition ceramics. $Zr_{(2-x)}Hf_{(x)}WP_2O_{12}$ and $Hf_2WP_2O_{12}$ exhibit large negative thermal expansion that is linear over a large temperature range up to at least 900° C., These new ceramic material particles may be mixed with polymers to make a composite suitable for use in backsheets for photovoltaic modules or in other applications. The thermal expansion coefficient of the composite can be tailored to match that of the solar cell in order to reduce stress resulting from daily thermal cycling.

19 Claims, 3 Drawing Sheets

PARTICLES IN
A POLYMER
(0.3)

PZT RODS IN
POLYMER (1-3)

HONEYCOMB
COMPOSITE
PARALLEL POLING
(1-3)

PZT SPHERES IN A
POLYMER (1-3)

DICED 1-3
COMPOSITE

PERFORATED
COMPOSITE
(3-1)

SANDWICH
COMPOSITE
(1-3)

SANDWICH
COMPOSITE
(3-3)

REPLAMIN (3-3)
COMPOSITE

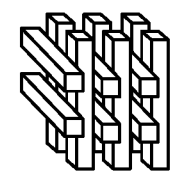
LADDER STRUCTURE (3-3)
FIGURE 2P
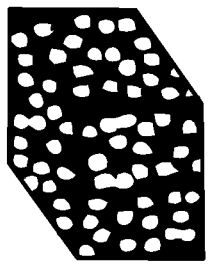
BURPS COMPOSITE (3-3)
FIGURE 2L
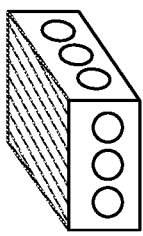
PERFORATED COMPOSITE (3-2)
FIGURE 2J
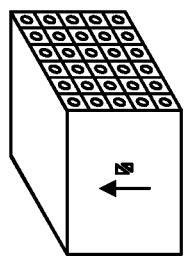
HONEYCOMB COMPOSITE TRANSVERSE POLING (3-1)
FIGURE 2C
LADDER STRUCTURE (3-3)
FIGURE 2Q
GLASS-CERAMIC COMPOSITE MODEL
FIGURE 2M
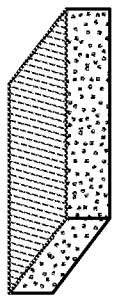
TRANSVERSE REINFORCEMENT (1-2-3-0)
FIGURE 2G
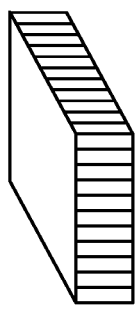
PVDF COMPOSITE MODEL
FIGURE 2D

TUNABLE NEGATIVE COEFFICIENT THERMAL EXPANSION MATERIALS AND COMPOSITES

CROSS-REFERENCE TO RELATED APPLICATIONS

This application claims priority to U.S. Provisional Patent Application Ser. No. 63/065,052, entitled "TUNABLE NEGATIVE COEFFICIENT THERMAL EXPANSION MATERIALS AND COMPOSITES," filed Aug. 13, 2020, the entirety of which is incorporated herein by reference.

STATEMENT REGARDING FEDERALLY SPONSORED RESEARCH OR DEVELOPMENT

The United States Government has rights in this invention pursuant to Contract No. DE-AC04-94AL85000 between the United States Department of Energy and Sandia Corporation, and pursuant to Contract No. DE-NA0003525 between the United State Department of Energy and National Technology and Engineering Solutions of Sandia, LLC, for the operation of the Sandia National Laboratories.

BACKGROUND OF THE INVENTION

The application generally relates to negative thermal expansion (NTE) materials and methods of making the same.

For most materials, thermal expansion upon heating is the rule. A select subclass of materials exists that contracts upon heating. These materials are conventionally referred to as negative thermal expansion (NTE) materials. Many of these materials exhibit less desirable anisotropic NTE meaning contraction in one or two dimensions with expansion in the third. Additionally, the NTE characteristic is typically limited to a narrow temperature range. Zirconium phospho-tungstate ($Zr_2PW_2O_{12}$) is among the few known materials exhibiting isotropic (equal in all three dimensions) NTE over a broad temperature range. Isotropic NTE materials are important for technological applications requiring composites designed to have overall zero or adjustable TE.

What is needed are new NTE materials that experience a linear isotropic contraction over a broad temperature range from 0° C. to 1000° C. or greater, that are chemically non-reactive, are thermally phase-stable over the same range, and are straightforward to synthesize.

SUMMARY OF THE INVENTION

According to an embodiment of the disclosure, a composition having the formula $Hf_2WP_2O_{12}$ is disclosed.

According to another embodiment of the disclosure, a composite that includes a polymer and hafnium phospho-tungstate particles dispersed in the polymer is disclosed.

According to another embodiment of the disclosure, a composition having the formula $Zr_{(2-x)}Hf_{(x)}WP_2O_{12}$, where $0 \leq x \leq 2$ is disclosed.

According to another embodiment of the disclosure, a composite that includes a polymer and hafnium substituted zirconium phospho-tungstate particles dispersed in the polymer is disclosed.

According to another embodiment of the disclosure, a photovoltaic module that includes a photovoltaic cell and a negative thermal expansion composite backsheet attached to the photovoltaic cell is disclosed. The negative thermal expansion composite backsheet includes a polymer and hafnium phospho-tungstate particles dispersed in the polymer.

According to another embodiment of the disclosure, a photovoltaic module that includes a photovoltaic cell and a negative thermal expansion composite backsheet attached to the photovoltaic cell is disclosed. The negative thermal expansion composite backsheet includes a polymer and $Zr_{(2-x)}Hf_{(x)}WP_2O_{12}$ particles dispersed in the polymer, where $0 \leq x \leq 2$.

According to another embodiment of the disclosure, a composite structure that includes a host and a negative thermal expansion composite sheet attached to the host is disclosed. The negative thermal expansion composite includes a polymer and hafnium phospho-tungstate or hafnium substituted zirconium phospho-tungstate particles dispersed in the polymer.

An advantage of the present invention is that the newly discovered family of compositions that contract as their temperature is increased allow for a tunable range in the Coefficient of Thermal Expansion (CTE) over the composition space. When used in composites, they can protect assembled components from failure caused by thermal stress.

Another advantage of the NTE composite is that a photovoltaic (PV) backsheet formed of the material will reduce or eliminate cracking due to thermal expansion stresses. Cracking in PV backsheets is a major failure mechanism, allowing oxygen and water into the sensitive components of the solar panel. By reducing or eliminating cracking of the PV backsheets, the useful lifetime of the PV panel could be extended dramatically.

An additional advantage of the NTE composite is its ready ability to form composites with many materials (polymers, cements, etc.). The composites can be regularly sized for homogenous mixing.

Alternative exemplary embodiments relate to other features and combinations of features as may be generally recited in the claims.

BRIEF DESCRIPTION OF THE DRAWINGS

The application will become more fully understood from the following detailed description, taken in conjunction with the accompanying figures, wherein like reference numerals refer to like elements, in which:

FIG. 2C shows an embodiment of a composition formulations and structure type according to an embodiment of the disclosure.

FIG. 2D shows an embodiment of a composition formulations and structure type according to an embodiment of the disclosure.

FIG. 2G shows an embodiment of a composition formulations and structure type according to an embodiment of the disclosure.

FIG. 2J shows an embodiment of a composition formulations and structure type according to an embodiment of the disclosure.

FIG. 2L shows an embodiment of a composition formulations and structure type according to an embodiment of the disclosure.

FIG. 2M shows an embodiment of a composition formulations and structure type according to an embodiment of the disclosure.

FIG. 2P shows an embodiment of a composition formulations and structure type according to an embodiment of the disclosure.

FIG. 2Q shows an embodiment of a composition formulations and structure type according to an embodiment of the disclosure.

DETAILED DESCRIPTION OF THE INVENTION

Figure 1:
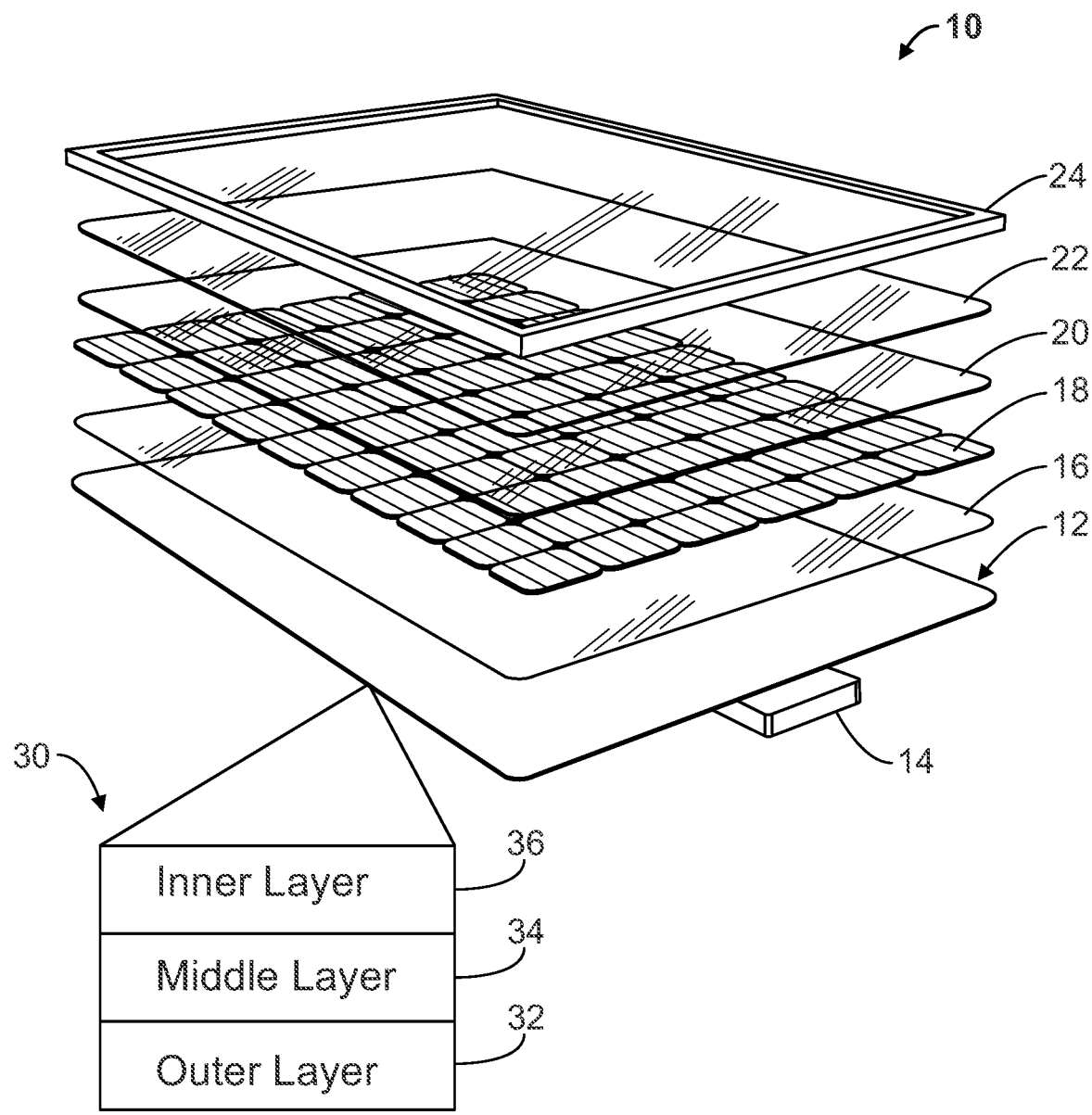
FIG. 1 shows an illustration of a PV module according to an embodiment of the disclosure.

Before turning to the figures which illustrate the exemplary embodiments in detail, it should be understood that the application is not limited to the details or methodology set forth in the following description or illustrated in the figures. It should also be understood that the phraseology and terminology employed herein is for the purpose of description only and should not be regarded as limiting.

The present disclosure is directed to hafnium phospho-tungstate ($Hf_2WP_2O_{12}$) and hafnium substituted zirconium phospho-tungstate ($Zr_{(2-x)}Hf_{(x)}WP_2O_{12}$), where $0 \leq x \leq 2$, negative thermal expansion (NTE) materials. As used herein, x is defined as $0 \leq x \leq 2$ unless otherwise specified. These materials are an improvement over zirconium NTE materials as the magnitude of the coefficient of thermal expansion of the Hf or Hf substituted materials is much larger than that of the Zirconium only material, ($-15.9 \times 10^{-6} K^{-1}$ as compared to $-1 \times 10^{-6} K^{-1}$), the new materials can cover a much larger range of coefficients of thermal expansion. Hafnium phospho-tungstate and hafnium substituted zirconium phospho-tungstate exhibit large negative thermal expansion that is linear over a large temperature range up to at least 900° C. According to the Rule of Mixtures, the thermal expansion of a composite is given by the volume weighted sum of the contributions from the matrix and the dispersed phase. The CTE of polyethylene terephthalate (PET), a typical backsheet polymer is near $20 \times 10^{-6} K^{-1}$, and the CTE of the $Zr_{(2-x)}Hf_{(x)}WP_2O_{12}$ materials range from $-1 \times 10^{-6} K^{-1}$ to $-15.9 \times 10^{-6} K^{-1}$. As a guide, a PET—$Hf_2WP_2O_{12}$ composite with a loading fraction of ~44% would create a composite with a CTE equal to that of a silicon solar cell, $4 \times 10^{-6} K^{-1}$.

In an embodiment, the hafnium phospho-tungstate and hafnium substituted zirconium phospho-tungstate are ceramic particles having a particle size of between 5 and 50 microns. In an embodiment, the NTE ceramic particles may have a particle size between 5 microns and 50 microns. In other embodiments, the NTE ceramic material may be formed into various shapes and sizes. For example, the NTE materials may be, but are not limited to, the shape of particles, plates and rods.

In other embodiments, the hafnium phospho-tungstate and that may also include additional components, such as, but not limited to a polymer binders, strength additives such as fibers, pigments and colorants, UV stabilizers and inhibitors such as $TiO2$, reflective materials.

The polymer may be but is not limited to conventional thermoplastics, such as polyethylene terephthalate (PET), but may also include epoxy polymers (thermosetting resins), packaging polymers, adhesive polymers such as methacrylates and modified methacrylates, pressure sensitive adhesives, paints and coatings, or hot melt adhesives. In an embodiment, the polymer may be a thermoplastic such as polyester, such as polyethylene terephthalate (PET), a polyurethane, a polyvinyl fluoride, or a polyvinylidene fluoride, or elastomers or polymer dispersions.

In an embodiment, the polymer may be, but is not limited to isocyanate terminated resins, MDI-polyesters, TDI-Polyesters, MDI-Polyethers, TDI polyethers, polycaprolactness, Diisocyanates, PET, PEF, PTF, PHA, thermoset resins such as epoxy, phenolic and amino resins, bismalemides and polyamides, thermoplastics such as but not limited to acrylics, ABS, Nylon, PLA, PBI, PES, Polycarbonates, POM, PEEK, PEI, polyethylene, PPO, PPS, PVC, PVDF, PTFE, Polystyrene, polypropylene and adhesives.

The NTE material may be loaded in the polymer at an amount greater than zero and less than 65%. In an embodiment, the loading may be between 4% and 40%. In another embodiment, the NTE material may be loaded in PET from between 5% and 25%.

According to another embodiment of the disclosure, a composite is disclosed that includes hafnium phospho-tungstate and/or hafnium substituted zirconium phospho-tungstate particles dispersed in a polymer. The particles are between 5 um and 150 um. In another embodiment, the particles are between 35 um to 70 um. In yet another embodiment, the particles are between 35 um to 45 um.

According to another embodiment, a device or structure is disclosed that includes one or more composite NTE backsheets layered upon or attached to a host. The host may be a structural or electrical component member or module. In such a manner the device or structure has a module laminate structure. In an embodiment, the module is a photovoltaic module. The photovoltaic module is disclosed that includes a crystalline silicon cell to which one or more composite NTE backsheets are attached.. In an embodiment, the composite backsheet includes two or more stacked or layered NTE material sheets of different coefficient of thermal expansions, where the multiple layers provide strength, UV resistance, chemical resistance, stiffness, and other functionality These ceramic materials mixed with polymers to make a composite suitable as backsheets for devices or structures, such as for photovoltaic modules, high resolution optics, micro-electronics, semiconductor cells, packaging, and adhesives to control heat effects. The thermal expansion coefficient of the composite can be tailored by varying the composite's composition to match that of surrounding components, such as the solar cell, in order to reduce stress resulting from thermal cycling. The NTE material can have multiple parameters tailored, such as, but not limited to the ceramic coefficient of thermal expansion of the hafnium substituted zirconium phospho-tungstate by varying x, its composition including but not limited to particle size and loading fraction to the polymer material.

According to yet another embodiment of the disclosure, a method of forming a device, component, composite or laminate structure is disclosed. The disclosed NTE material is mixed with a polymer to make an NTE composite that can be attached or joined to a host structure. In an embodiment, the device may be a PV module having the NTE composite as a backsheet attached to a solar cell. The NTE composite may be joined to the host structure by joining methods such as, but not limited to epoxy or glue bonding, vacuum forming, melt application, or lamination.

FIG. 1 illustrates an exemplary embodiment of a PV module 10 that includes a NTE composite structure 12 according to the present disclosure. In this example, the device 10, a PV module 10 that in addition to the NTE composite structure 12 would also include a junction box 14, an encapsulant 16, a solar cell 18, a second encapsulant 20, a glass layer 22 and a frame 24. Components other than the NTE composite structure 12 are conventional in the field. The encapsulant 16, a solar cell 18, a second encapsulant 20, a glass layer 22 and a frame 24 may be referred to collectively as the host. The encapsulant layers 12 and 18 are formed of a protective polymer elastomer, such as, but not limited to a poly(ethylene vinyl acetate), polyvinyl fluoride (PVF) film.

As can be seen in FIG. 1, the NTE composite structure 12 is attached to the backside of the encapsulant 16. The NTE composite protects the rear side of the PV module 10. In this exemplary embodiment, the NTE composite structure 12 is attached by the encapsulant thereby forming a lamination. In other embodiments, the NTE composite structure 12 may be attached by other joining methods as discussed above.

Expanded section 30 shows a cross-section of the NTE composite structure 12. In this exemplary embodiment, the NTE composite structure 12 includes an outer layer 32, an NTE composite layer 34 and an inner layer 36. The outer layer 32 provides environmental protection including UV protection for the other layers. The outer layer 32 is a UV protection layer that includes $TiO_2$, a UV stabilizer. In this exemplary embodiment, the inner layer 36 is EVA that is an adhesion layer that is joined to the encapsulant 16. The NTE composite layer 34 is formed from NTE composite material as described above. In other embodiments, various laminate configurations may be used for the backsheet structure 30 including one or more NTE composite layers of the same or different compositions, for example to vary the thermal expansion gradient. In yet other embodiments, components other than the NTE composite layer 34 may be modified, added or deleted to suit the application and joining method.

In other embodiments, the structure or host to which the NTE composite may be attached may be metal, ceramic, composite or glass. For example, the host may be a PV structure formed of a series of crystalline silicon cells to which the NTE composite may be attached.

Figure 2A:
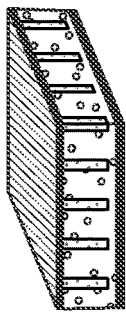
FIG. 2A shows an embodiment of a composition formulations and structure type according to an embodiment of the disclosure.

FIGS. 2A-Q illustrates various particle and polymer composite types and geometries according to various embodiments of the disclosure. The arrangement of NTE material in the polymer matrix can affect the properties of the composite including mechanical strength and electrical characteristics.

FIG. 2A shows an embodiment of a composition formulations and structure type according to an embodiment of the disclosure. As can be seen in FIG. 2A, the NTE composite can be incorporated into the polymer matrix in a random manner, in non-homogenous sized fractions.

Figure 2E:
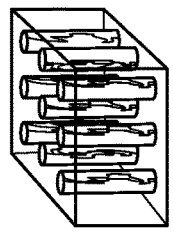
FIG. 2E shows an embodiment of a composition formulations and structure type according to an embodiment of the disclosure.
Figure 2B:
FIG. 2B shows an embodiment of a composition formulations and structure type according to an embodiment of the disclosure.

FIG. 2B shows an embodiment of a composition formulations and structure type according to an embodiment of the disclosure. As can be seen in FIG. 2B, the NTE composite can be incorporated in a connected, 1-D manner aligned in parallel in the y direction.

FIG. 2C shows an embodiment of a composition formulations and structure type according to an embodiment of the disclosure. As can be seen in FIG. 2C, the NTE composite can be incorporated in a connected, 1-D manner aligned in parallel in the x direction.

FIG. 2D shows an embodiment of a composition formulations and structure type according to an embodiment of the disclosure. As can be seen in FIG. 2D, the NTE composite can be uniformly sized and evenly dispersed throughout as particles.

FIG. 2E shows an embodiment of a composition formulations and structure type according to an embodiment of the disclosure. As can be seen in FIG. 2E, the NTE composite can be incorporated as rods parallel to the y axis.

Figure 2H:
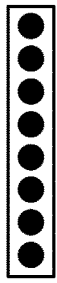
FIG. 2H shows an embodiment of a composition formulations and structure type according to an embodiment of the disclosure.
Figure 2I:
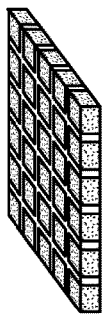
FIG. 2I shows an embodiment of a composition formulations and structure type according to an embodiment of the disclosure.
Figure 2F:
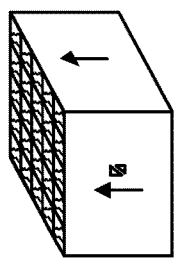
FIG. 2F shows an embodiment of a composition formulations and structure type according to an embodiment of the disclosure.

FIG. 2F shows an embodiment of a composition formulations and structure type according to an embodiment of the disclosure. As can be seen in FIG. 2F, the NTE composite can be incorporated as particles throughout with void parallel channels perforating the composite along the z-axis.

FIG. 2G shows an embodiment of a composition formulations and structure type according to an embodiment of the disclosure. As can be seen in FIG. 2G, the NTE composite can be incorporated as particles throughout with reinforcement from other fibers or rods of NTE.

FIG. 2H shows an embodiment of a composition formulations and structure type according to an embodiment of the disclosure. As can be seen in FIG. 2H, the NTE composite can be incorporated as uniform spheres.

FIG. 2I shows an embodiment of a composition formulations and structure type according to an embodiment of the disclosure. As can be seen in FIG. 2I, the NTE composite can be formed of blocks of polymer separated by composite material.

FIG. 2J shows an embodiment of a composition formulations and structure type according to an embodiment of the disclosure. As can be seen in FIG. 2J, the NTE composite can be incorporated as particles throughout with intersecting void channels perforating the composite along the z-axis and the x-axis.

Figure 2N:
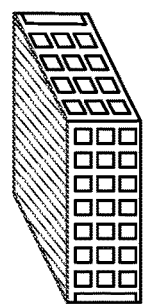
FIG. 2N shows an embodiment of a composition formulations and structure type according to an embodiment of the disclosure.
Figure 2O:
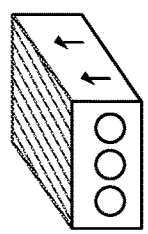
FIG. 2O shows an embodiment of a composition formulations and structure type according to an embodiment of the disclosure.
Figure 2K:
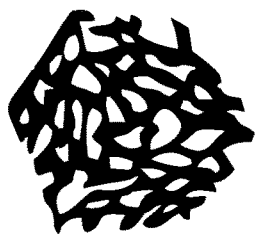
FIG. 2K shows an embodiment of a composition formulations and structure type according to an embodiment of the disclosure.

FIG. 2K shows an embodiment of a composition formulations and structure type according to an embodiment of the disclosure. As can be seen in FIG. 2K, a composite type exists of random veined-like composite features in a polymer.

FIG. 2L shows an embodiment of a composition formulations and structure type according to an embodiment of the disclosure. As can be seen in FIG. 2L, the NTE composite type exists of random void spheres in the composite material.

FIG. 2M shows an embodiment of a composition formulations and structure type according to an embodiment of the disclosure. As can be seen in FIG. 2M, the NTE composite could be formed around glass and/or ceramic rods.

FIG. 2N shows an embodiment of a composition formulations and structure type according to an embodiment of the disclosure. As can be seen in FIG. 2N, the NTE composite could be formed between sandwiching materials where one or both of the materials have teeth features that protrude into the composite.

FIG. 2O shows an embodiment of a composition formulations and structure type according to an embodiment of the disclosure. As can be seen in FIG. 2O, the NTE composite could be formed between sandwiching materials and grid framing materials.

FIG. 2P shows an embodiment of a composition formulations and structure type according to an embodiment of the disclosure. As can be seen in FIG. 2P, the NTE composite could be formed into a 3-D network of intersecting segments in the x, y, and z directions.

FIG. 2Q shows an embodiment of a composition formulations and structure type according to an embodiment of the disclosure. As can be seen in FIG. 2Q, the NTE composite could be formed into a 3-D network of offset segments along the x, y, and z directions Synthesis Routes:

The general synthesis method described below is modified from the known sol-gel synthesis route for $Zr_2WP_2O_{12}$. The molar ratio of $Hf_xZr_{(2-x)}$ to P was held constant at 1 to 1, while the W molar ratio was between 0.5 and 0.6. 0.007842 mol Ammonium Phosphate monobasic (Sigma-Aldrich), $NH_4H_2PO_4$ and the Ammonium metatungstate $(NH_4)_{10}(H_2W_{12}O_{42})*xH_2O$ (Sigma-Aldrich) was mixed with amounts of DI $H_2O$ varying from 50 mL to 300 mL. The solution was covered and stirred for a minimum of 30 min and up to 24 hours.

Using the molar ratios described above, Zirconyl oxychloride octahydrate and either Hafnium chloride or Hafnium oxychloride hydrate was mixed with 10 mL DI $H_2O$ and stirred until dissolved. This Zr/Hf solution was then slowly added dropwise to the phospho-tungsten solution while stirring. A white precipitate formed immediately. After an additional stirring, the pH was found to be highly acidic, <1 and the white precipitate was noticeably finer.

The solution was loaded into a Teflon-lined Parr vessel and placed in an oven at 130° C. for 48 hours. Upon removal from the Parr vessel, the fine white precipitate was filtered and washed with DI water. After drying in an oven at 80° C. at least 6 hours and up to 48 hours, the precipitate was fired in a 900° C. furnace for at least 4 hours after a ramp rate of 10 deg/min, and subsequently allowed to cool to room temperature.

NTE Composite:

The composite may be formed by various known polymer processing methods. For example, solvent casting, melt-extrusion or other polymer processing methods may be used. In an example, PET was mixed with trifluoroacetic acid (TFA) and dichloromethane (DCM) until dissolved. Ceramic particles were then mixed into the solution until evenly dispersed. In order to form a film, the solution was cast onto a glass slide and the solvent allowed to evaporate.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A composition having the formula $Hf_2WP_2O_{12}$.

2. A composite, comprising:
   a polymer; and
   hafnium phospho-tungstate particles dispersed in the polymer.

3. The composite of claim 2, wherein the polymer is selected from the group consisting of urethanes, thermosetting resins, bismalemides, polyamides, polyesters, polyurethanes, polyvinyl fluorides, polyvinylidene fluorides, elastomers and thermoplastics.

4. The composite of claim 2, wherein the hafnium phospho-tungstate particles are present in the composite to a load value up to 65%.

5. A composition having the formula $Zr_{(2-x)}Hf_{(x)}WP_2O_{12}$, where $0<x\leq2$.

6. A composite, comprising:
   a polymer; and
   hafnium substituted zirconium phospho-tungstate particles dispersed in the polymer.

7. The composite of claim 6, wherein the hafnium substituted zirconium phospho-tungstate has the formula $Zr_{(2-x)}Hf_{(x)}WP_2O_{12}$, where $0<x\leq2$.

8. The composite of claim 6, wherein the polymer is selected from the group consisting of urethanes, thermosetting resins, bismalemides, polyamides, polyesters, polyurethanes, polyvinyl fluorides, polyvinylidene fluorides, elastomers and thermoplastics.

9. The composite of claim 6, wherein the hafnium substituted zirconium phospho-tungstate particles are present in the composite to a load value up to 65%.

10. A photovoltaic module, comprising:
    a photovoltaic cell; and
    a negative thermal expansion composite backsheet attached to the photovoltaic cell;
    wherein the negative thermal expansion composite backsheet comprises:
      a polymer; and
      hafnium phospho-tungstate particles dispersed in the polymer.

11. The module of claim 10, wherein the polymer is selected from the group consisting of urethanes, thermosetting resins, bismalemides, polyamides, polyesters, polyurethanes, polyvinyl fluorides, polyvinylidene fluorides, elastomers and thermoplastics.

12. The module of claim 10, wherein the hafnium phospho-tungstate particles are present in the polymer to a load value up to 65%.

13. A photovoltaic module, comprising:
    a photovoltaic cell; and
    a negative thermal expansion composite backsheet attached to the photovoltaic cell;
    wherein the negative thermal expansion composite backsheet comprises:
      a polymer; and
      $Zr_{(2-x)}Hf_{(x)}WP_2O_{12}$ particles dispersed in the polymer, where $0\leq x\leq2$.

14. The module of claim 13, wherein the polymer is selected from the group consisting of urethanes, thermosetting resins, bismalemides, polyamides, polyesters, polyurethanes, polyvinyl fluorides, polyvinylidene fluorides, elastomers and thermoplastics.

15. The module of claim 13, wherein the $Zr_{(2-x)}Hf_{(x)}WP_2O_{12}$ particles are present in the polymer to a load value up to 65%.

16. A composite structure, comprising:
a host; and
a negative thermal expansion composite sheet attached to the host;
wherein the negative thermal expansion composite back-sheet comprises:
a polymer; and
hafnium phospho-tungstate or hafnium substituted zirconium phospho-tungstate particles dispersed in the polymer.

17. The structure of claim 16, wherein the polymer is selected from the group consisting of urethanes, thermosetting resins, bismalemides, polyamides, polyesters, polyurethanes, polyvinyl fluorides, polyvinylidene fluorides, elastomers and thermoplastics.

18. The structure of claim 16, wherein the host is selected from a group consisting of photovoltaic components, microelectronics, semiconductor cells, packaging and adhesives.

19. The structure of claim 16, wherein hafnium phospho-tungstate or hafnium substituted zirconium phospho-tungstate particles are present in the polymer to a load value up to 65%.

\* \* \* \* \*